(12) United States Patent
Cao et al.

(10) Patent No.: US 12,171,113 B2
(45) Date of Patent: Dec. 17, 2024

(54) FLEXIBLE OLED SUBSTRATE AND ENCAPSULATION METHOD THEREOF

(71) Applicant: Shenzhen China Star Optoelectronics Semiconductor Display Technology Co., Ltd., Guangdong (CN)

(72) Inventors: Weiran Cao, Guangdong (CN); Jinchuan Li, Guangdong (CN); Jinxing Chu, Guangdong (CN)

(73) Assignee: SHENZHEN CHINA STAR OPTOELECTRONICS SEMICONDUCTOR DISPLAY TECHNOLOGY CO., LTD., Guangdong (CN)

( * ) Notice: Subject to any disclaimer, the term of this patent is extended or adjusted under 35 U.S.C. 154(b) by 340 days.

(21) Appl. No.: 17/624,025

(22) PCT Filed: Dec. 21, 2021

(86) PCT No.: PCT/CN2021/140188
§ 371 (c)(1),
(2) Date: Dec. 30, 2021

(87) PCT Pub. No.: WO2023/108732
PCT Pub. Date: Jun. 22, 2023

(65) Prior Publication Data
US 2023/0200111 A1 Jun. 22, 2023

(30) Foreign Application Priority Data
Dec. 17, 2021 (CN) .......................... 202111555039.6

(51) Int. Cl.
*H10K 50/844* (2023.01)
*H10K 50/842* (2023.01)
(Continued)

(52) U.S. Cl.
CPC .......... *H10K 50/844* (2023.02); *H10K 71/00* (2023.02); *H10K 59/12* (2023.02);
(Continued)

(58) Field of Classification Search
CPC .. H10K 50/84; H10K 50/842; H10K 50/8426; H10K 50/8428; H10K 50/844;
(Continued)

(56) References Cited

U.S. PATENT DOCUMENTS

| 2013/0241402 | A1 | 9/2013 | Wang | |
|---|---|---|---|---|
| 2016/0155984 | A1* | 6/2016 | Yamazaki | H10K 59/12 257/40 |
| 2020/0098291 | A1* | 3/2020 | Wu | H10K 59/12 |

FOREIGN PATENT DOCUMENTS

| CN | 204464289 U | 7/2015 |
|---|---|---|
| CN | 106129084 A | 11/2016 |

(Continued)

*Primary Examiner* — Sonya McCall-Shepard
(74) *Attorney, Agent, or Firm* — Rivka Friedman

(57) ABSTRACT

A flexible organic light-emitting diode (OLED) substrate includes a flexible substrate, an inorganic barrier layer, an OLED device, and an adhesive-filling layer. The inorganic barrier layer is disposed on the flexible substrate. The OLED device is disposed on the inorganic barrier layer. The adhesive-filling layer covers the OLED device and the inorganic barrier layer. The flexible substrate further comprises a base substrate, a bending portion, and a covering portion. A thin film transistor layer is disposed on the base substrate, and the bending portion is connected to the base substrate and the covering portion. The covering portion covers the adhesive-filling layer and is stacked above the base substrate.

12 Claims, 3 Drawing Sheets

(51) Int. Cl.
*H10K 59/12* (2023.01)
*H10K 59/80* (2023.01)
*H10K 71/00* (2023.01)
*H10K 71/80* (2023.01)
*H10K 77/10* (2023.01)
*H10K 102/00* (2023.01)

(52) U.S. Cl.
CPC ..... *H10K 59/1201* (2023.02); *H10K 59/8722* (2023.02); *H10K 77/111* (2023.02); *H10K 2102/311* (2023.02); *H10K 2102/351* (2023.02)

(58) Field of Classification Search
CPC .... H10K 50/8445; H10K 59/10; H10K 59/12; H10K 59/1201; H10K 59/1213; H10K 77/00; H10K 77/10; H10K 77/111; H10K 2102/311; H10K 59/124; H10K 71/00; H10K 59/8722; H10K 59/87; H10K 50/841; G09F 9/301; G06F 1/1652
See application file for complete search history.

(56) References Cited

FOREIGN PATENT DOCUMENTS

| | | | |
|---|---|---|---|
| CN | 106155384 | A | 11/2016 |
| CN | 106159104 | A | 11/2016 |
| CN | 112820199 | A | 5/2021 |

\* cited by examiner

FLEXIBLE OLED SUBSTRATE AND ENCAPSULATION METHOD THEREOF

FIELD OF DISCLOSURE

The present invention relates to a field of an encapsulation process and manufacturing technology and in particular, to a flexible OLED substrate and an encapsulation method thereof.

DESCRIPTION OF RELATED ART

OLEDs (organic light-emitting diodes) have an organic light-emitting layer. The organic light-emitting layer is a film of organic compounds that emit light in response to an electric current. An organic material is sandwiched between two electrodes. At least one of the electrodes is a light-transmissive electrode. OLEDs exhibit high self-illuminating properties, high efficiency, and require low driving voltage, so OLEDs are extensively used in display screens. However, the use of OLEDs for displays requires specific handling. Specifically, exposure to moisture or oxygen can cause severe damage to the organic light-emitting layer. Therefore, it is critical to package OLEDs well, such that they are protected from moisture and oxygen.

Thin film encapsulation (TFE) is a main encapsulation method used for flexible OLED display devices, and a common method is to produce inorganic, organic, or a combination thereof on the OLED device. Inorganic layers can be deposited by using any one of many standard deposition techniques, including chemical vapor deposition (CVD), physical vapor deposition (PVD), or atomic layer deposition (ALD). However, none of these encapsulation methods can completely block water and oxygen to protect the device from entry of moisture and oxygen.

SUMMARY

It is an object of the present invention to provide a flexible OLED substrate and an encapsulation method for the flexible OLED substrate, which can completely block water and oxygen, so that OLED devices are protected from entry of moisture and oxygen, thus effectively improving an encapsulation effect and extending a lifespan of the OLED devices.

Accordingly, the present invention provides a flexible organic light-emitting diode (OLED) substrate, comprising: a flexible substrate, an inorganic barrier layer, an OLED device, and an adhesive-filling layer. The inorganic barrier layer is disposed on the flexible substrate. The OLED device is disposed on the inorganic barrier layer. The adhesive-filling layer covers the OLED device and the inorganic barrier layer, wherein the flexible substrate further comprises a base substrate, a bending portion, and a covering portion. A thin film transistor layer is disposed on the base substrate, and the bending portion is connected to the base substrate and the covering portion. The covering portion covers the adhesive-filling layer and is stacked above the base substrate.

Preferably, the flexible OLED substrate further comprises a border adhesive disposed on edges of the adhesive-filling layer and the OLED device.

Preferably, the border adhesive, the adhesive-filling layer, and the inorganic barrier layer together enclose the OLED device.

Preferably, a thickness of the inorganic barrier layer ranges from 100 nm to 5000 nm, and a material of the inorganic barrier layer comprises one or more of aluminum oxide, titanium oxide, chromium oxide, silicon nitride, silicon oxynitride, or silicon oxide.

The present invention further provides an encapsulation method for a flexible organic light-emitting diode (OLED) substrate, comprising following steps:

providing a glass substrate, wherein the glass substrate comprises a first substrate portion and a second substrate portion connected to each other;

providing a flexible substrate on the first substrate portion and the second substrate portion, and producing an inorganic barrier layer on a surface of the flexible substrate away from the glass substrate;

producing an OLED device on the inorganic barrier layer corresponding to the first substrate portion, and producing an adhesive-filling layer on the flexible substrate corresponding to the second substrate portion; and bending the first substrate portion to press against the second substrate portion or bending the second substrate portion to press against the first substrate portion, so that the flexible substrate is spaced apart from the OLED device by the adhesive-filling layer and covers the OLED device.

Preferably, the step of providing the glass substrate further comprises forming a gap between the first substrate portion and the second substrate portion.

Preferably, in the step of producing the flexible substrate, the flexible substrate forms a base substrate, a bending portion, and an covering portion, wherein a thin film transistor (TFT) layer is formed on the base substrate and drives the OLED device to emit light, the bending portion is connected to the base substrate and the covering portion, the covering portion covers the adhesive-filling layer and is stacked above the base substrate, and the gap is formed by cutting and allows formation of the bending portion.

Preferably, the step of producing the adhesive-filling layer further comprises coating a border adhesive on an edge of the second substrate portion, wherein the border adhesive is connected to the adhesive-filling layer, wherein when the flexible substrate is bent and covers the OLED device, the inorganic barrier layer, the adhesive-filling layer, and the border adhesive together enclose the OLED device, and wherein the adhesive-filling layer and the border adhesive are formed on two edges of the OLED device.

Preferably, after the step of bending the first substrate portion to press against the second substrate portion or bending the second substrate portion to press against the first substrate portion, the encapsulation method further comprises peeling the glass substrate and curing the border adhesive; after the glass substrate is peeled, detaching the glass substrate from the flexible substrate to expose the flexible substrate; curing the border adhesive by ultraviolet light to form a sealant frame to complete encapsulation of the OLED substrate.

Preferably, a thickness of the inorganic barrier layer ranges from 100 nm and 5000 nm, and a material of the inorganic barrier layer comprises one or more of aluminum oxide, titanium oxide, chromium oxide, silicon nitride, silicon oxynitride, or silicon oxide.

The present invention further provides an encapsulation method for a flexible organic light-emitting diode (OLED) substrate, comprising following steps:

providing a glass substrate, wherein the glass substrate forms a first substrate portion and a second substrate portion connected to each other;

providing a flexible substrate on the first substrate portion and the second substrate portion, and producing an inorganic barrier layer on a surface of the flexible substrate away from the glass substrate;

producing an OLED device on the inorganic barrier layer corresponding to the first substrate portion, and producing an adhesive-filling layer on the flexible substrate corresponding to the second substrate portion; and bending the first substrate portion to press against the second substrate portion or bending the second substrate portion to press against the first substrate portion.

Preferably, the step of providing the glass substrate further comprises forming a gap between the first substrate portion and the second substrate portion.

Preferably, in the step of producing the flexible substrate, the flexible substrate forms a base substrate, a bending portion, and an covering portion, wherein a thin film transistor (TFT) layer is formed on the base substrate and drives the OLED device to emit light, the bending portion is connected to the base substrate and the covering portion, and the covering portion covers the adhesive-filling layer and is stacked above the base substrate, wherein the gap is formed by cutting and allows formation of the bending portion.

Preferably, the step of producing the adhesive-filling layer further comprises coating a border adhesive on an edge of the second substrate portion, wherein the border adhesive is connected to the adhesive-filling layer; when the flexible substrate is bent and covers the OLED device, the flexible substrate is spaced apart from the OLED device by the adhesive-filling layer; the inorganic barrier layer, the adhesive-filling layer, and the border adhesive together enclose the OLED device; the adhesive-filling layer and the border adhesive are formed on two edges of the OLED device.

Preferably, after the step of bending the first substrate portion to be pressed against the second substrate portion or bending the second substrate portion to be pressed against the first substrate portion, the encapsulation method further comprises peeling the glass substrate and curing the border adhesive; after the glass substrate is peeled, detaching the glass substrate from the flexible substrate to expose the flexible substrate; and curing the border adhesive by ultraviolet light to form a sealant frame to complete an encapsulation of the OLED substrate.

Preferably, a thickness of the inorganic barrier layer ranges from 100 nm and 5000 nm, and a material of the inorganic barrier layer comprises one or more of aluminum oxide, titanium oxide, chromium oxide, silicon nitride, silicon oxynitride, or silicon oxide.

Advantages of the Present Application:

The present invention further has the following functions. The flexible substrate of the present invention has an inorganic barrier layer instead of an additional deposited barrier layer, simplifying the encapsulation process. Furthermore, the OLED device is manufactured on one side of the flexible substrate, and the adhesive-filling layer and the border adhesive (a dam adhesive material) are coated on another side of the flexible substrate. Then, the adhesive-filling layer 140 and the border adhesive are attached to the OLED device by bending the first substrate portion or the second substrate portion, thus completing encapsulation of the OLED substrate. The OLED substrate is provided with the adhesive-filling layer and the border adhesive at edges, which both provide water-resistant properties, and the inorganic barrier layer of the flexible substrate is also water-resistant. Therefore, the present invention can achieve multi-layer and effective encapsulation, thus avoiding the OLED device from an influence of moisture and oxygen and enhancing the encapsulation effect and improving a service life of the OLED substrate.

BRIEF DESCRIPTION OF DRAWINGS

In order to more clearly illustrate the embodiments of the present disclosure or related art, figures which will be described in the embodiments are briefly introduced hereinafter. It is obvious that the drawings are merely for the purposes of illustrating some embodiments of the present disclosure, and a person having ordinary skill in this field can obtain other figures according to these figures without inventive work.

DETAILED DESCRIPTION OF EMBODIMENTS

The reference to "embodiment" in the specific embodiments means that a specific feature, structure, or characteristic described in conjunction with the embodiment may be included in at least one embodiment of the present invention. The same terms appearing in different positions in the specification are not necessarily limited to the same embodiment, but should be understood as an embodiment independent or alternative to other embodiments. Under the enlightenment of the technical solutions disclosed in the embodiments provided by the present invention, those of ordinary skill in the art can change the described embodiments of the present invention or combine other technical solutions based on the concept of the present invention.

Figure 1:
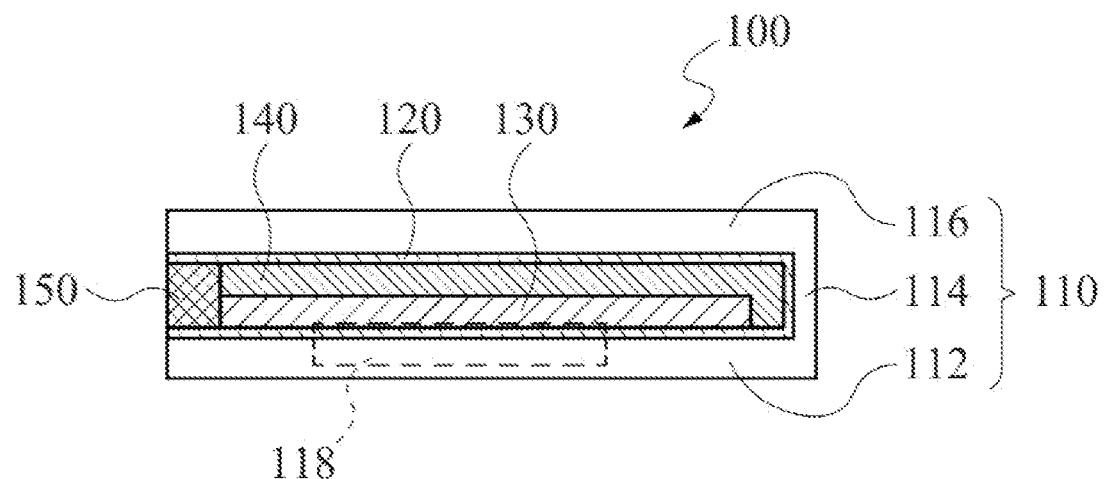
FIG. 1 is a schematic cross-sectional view of a flexible OLED substrate of the present invention.
Figure 2:
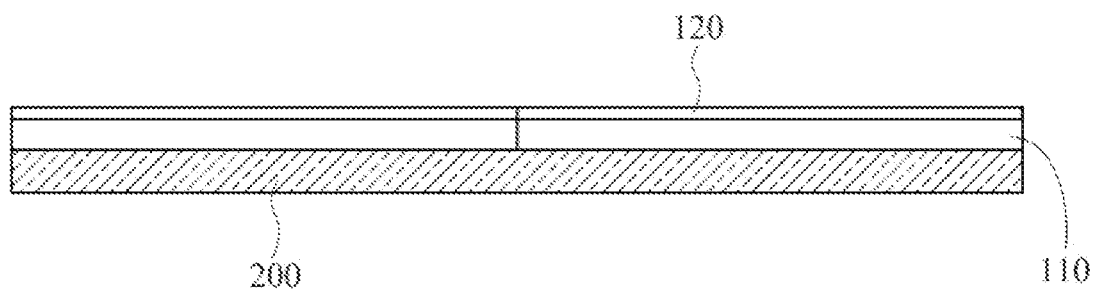
FIG. 2 is a first cross-sectional view of an encapsulation method of the flexible OLED substrate of the present invention.
Figure 3:
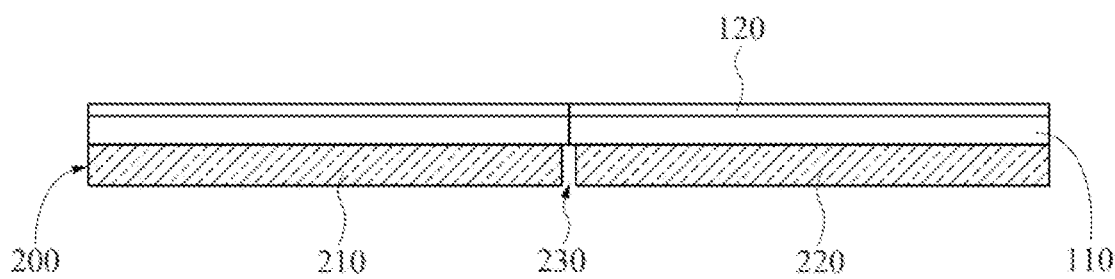
FIG. 3 is a second cross-sectional view of the encapsulation method of the flexible OLED substrate of the present invention.
Figure 4:
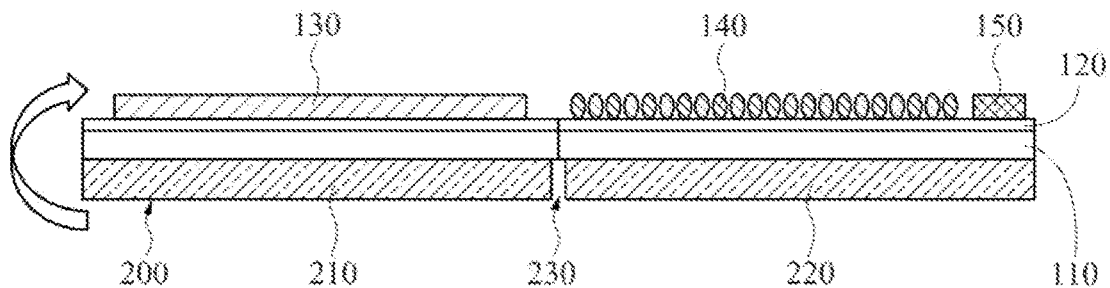
FIG. 4 is a third cross-sectional view of the encapsulation method of the flexible OLED substrate of the present invention.
Figure 5:
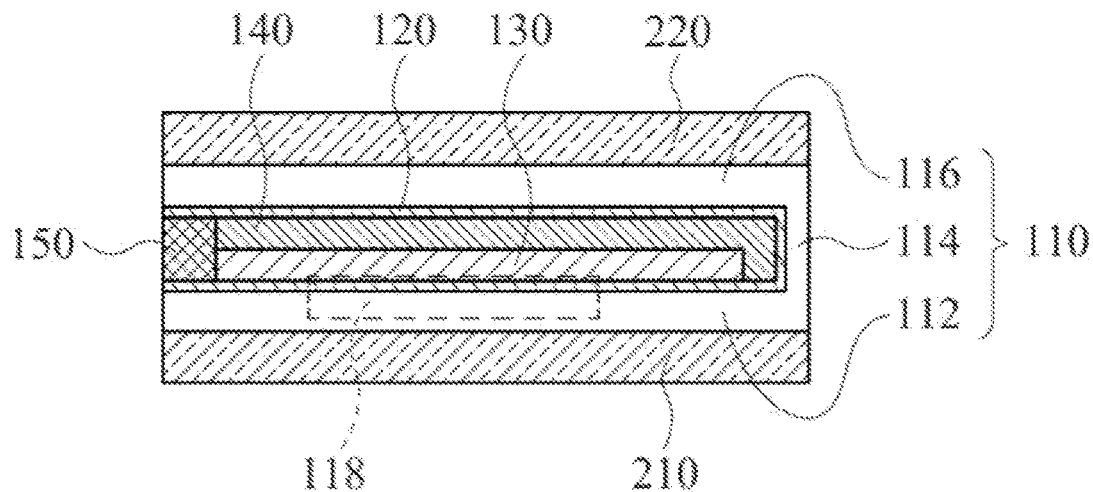
FIG. 5 is a fourth cross-sectional view of the encapsulation method of the flexible OLED substrate of the present invention.
Figure 6:
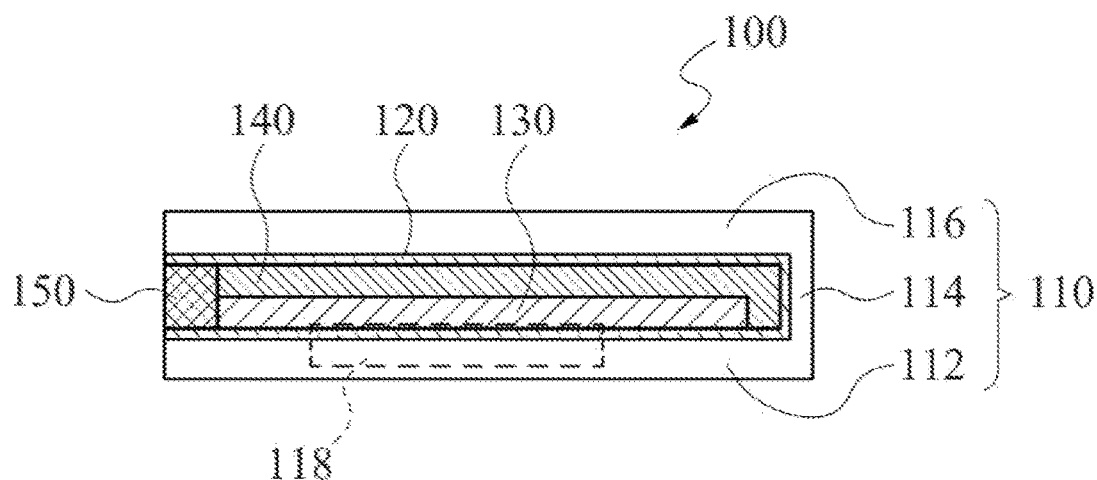
FIG. 6 is a fifth cross-sectional view of the encapsulation method of the flexible OLED substrate of the present invention.
Figure 7:
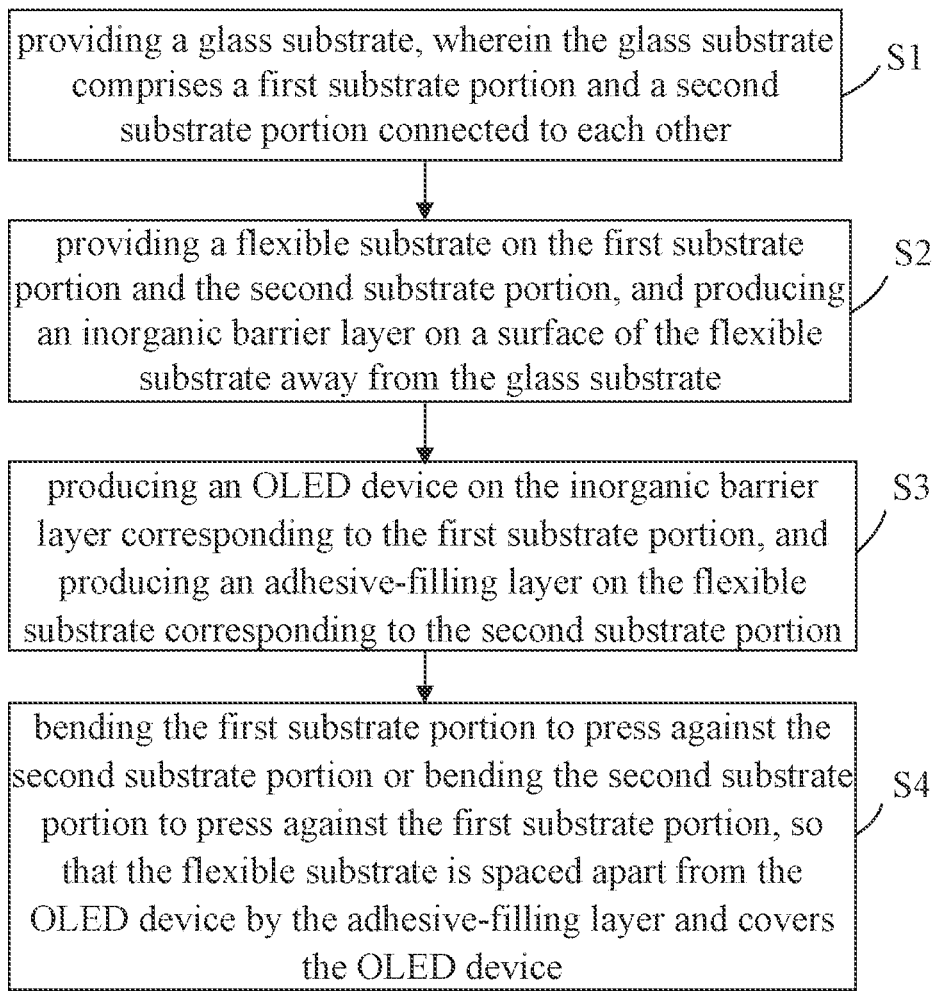
FIG. 7 is a process flow diagram of the encapsulation method of the flexible OLED substrate according to the present invention

Please refer to FIG. 1, which shows a cross-sectional view of a flexible OLED substrate of the present invention. As shown in the drawing, the present invention provides a flexible organic light-emitting diode (OLED) substrate 100. The flexible OLED substrate 100 comprises a flexible substrate 110, an inorganic barrier layer 120, an OLED device 130, and an adhesive-filling layer 140. The inorganic barrier layer 120 is disposed on the flexible substrate 110. The OLED device 130 is disposed on the inorganic barrier layer 120. The adhesive-filling layer 140 covers the OLED device 130 and the inorganic barrier layer 120.

In the embodiment shown in FIG. 1, the flexible OLED substrate 100 further comprises a border adhesive 150 on edges of the adhesive-filling layer 140 and the OLED device 130. The border adhesive 150, the adhesive-filling layer 140, and inorganic barrier layer 120 together enclose the OLED device 130. The flexible substrate 110 further comprises a base substrate 112, a bending portion 114, and a covering portion 116. A thin film transistor (TFT) layer 118 is disposed on the base substrate 112, and the bending portion 114 is connected to the base substrate 112 and the covering portion 116. The covering portion 116 covers the adhesive-filling layer 140 and is stacked above the base substrate 112.

Specifically, the OLED device 130 is encapsulated by the inorganic barrier layer 120, the adhesive-filling layer 140, and the border adhesive 150, wherein the adhesive-filling layer 140 and the border adhesive 150 are formed on two edges of the OLED device 130, thereby enhancing the encapsulation. In addition, the flexible substrate 110 itself has an inorganic barrier layer 120 instead of an additional deposited barrier layer, thus simplifying an encapsulation process. The flexible substrate 110 of this embodiment use its own material (i.e., the inorganic barrier layer 120) instead of an additional barrier layer that needs to be deposited additionally, thus simplifying the encapsulation process. A material of the flexible substrate 110 is, for example, polyimide (PI), PET, and several other common materials; however, the present embodiment is not limited in this regard.

A thickness of the inorganic barrier layer 120 ranges from 100 nm to 5000 nm, and the inorganic barrier layer 120 is made of one or more of aluminum oxide, titanium oxide, chromium oxide, silicon nitride, silicon oxynitride, or silicon oxide.

Please refer to FIGS. 2 to 7. The present invention further provides an encapsulation method for a flexible organic light-emitting diode (OLED) substrate 100, comprising following steps. Step S1: providing a glass substrate 200, the glass substrate 200 comprises a first substrate portion 210 and a second substrate portion 220 connected to each other. Step S2: providing a flexible substrate 110 on the first substrate portion 210 and the second substrate portion 220, and producing an inorganic barrier layer 120 on a surface of the flexible substrate 110 away from the glass substrate 200. Step S3: producing an OLED device 130 on the inorganic barrier layer 120 corresponding to the first substrate portion 210, and producing an adhesive-filling layer 140 on the flexible substrate 110 corresponding to the second substrate portion 220. Step S4: bending the first substrate portion 210 to press against the second substrate portion 220 or bending the second substrate portion 220 to press against the first substrate portion 210, so that the flexible substrate 110 is spaced apart from the OLED device 130 by the adhesive-filling layer 140 and covers the OLED device 130.

Step S1 of providing the glass substrate 200 further comprises forming a gap 230 between the first substrate portion 210 and the second substrate portion 220 (so as to facilitate bending the first substrate portion 210 onto the second substrate portion 220 or bending the second substrate portion 220 onto the first substrate portion 210). In step S2 of producing the flexible substrate 110, the flexible substrate 110 further comprises a base substrate 112, a bending portion 114, and a covering portion 116. A thin film transistor (TFT) layer 118 is formed on the base substrate 112 and drives the OLED device 130 to emit light. The bending portion 114 is connected to the base substrate 112 and the covering portion 116, and the covering portion 116 covers the adhesive-filling layer 140 and is stacked above the base substrate 112. The gap 230 is formed by cutting or other suitable methods and allows formation of the bending portion 114. The present embodiment does not limit the method of forming the gap 230.

The step S3 of producing the adhesive-filling layer further comprises coating a border adhesive 150 on an edge of the second substrate portion 220. When the flexible substrate 110 is bent and covers the OLED device 130, the inorganic barrier layer 120, the adhesive-filling layer 140, and the border adhesive 150 together enclose the OLED device 130. The adhesive-filling layer 140 and the border adhesive 150 are formed on two edges of the OLED device 130.

After the step S4 of bending the first substrate portion 210 to press against the second substrate portion 220 or bending the second substrate portion 220 to press against the first substrate portion 210, the encapsulation method further comprises peeling the glass substrate 200 and curing the border adhesive 150. After the glass substrate 200 is peeled, the glass substrate 200 is removed from the flexible substrate 110 to expose the flexible substrate 110, and the border adhesive 150 is cured by ultraviolet light (UV) to form a sealant frame, thereby completing the encapsulation of the OLED substrate 100.

It should be noted that a thickness of the inorganic barrier layer 120 ranges from 100 nm and 5000 nm. The inorganic barrier layer 120 is made of one or more of aluminum oxide (AlxOx), titanium oxide (TiOx), chromium oxide (CrOx), silicon nitride (SiNx), Silicon oxynitride (SiONx), or silicon oxide (SiOx).

The flexible substrate 110 in the present embodiment has an inorganic barrier layer 120 instead of an additional deposited barrier layer, thus simplifying the encapsulation process. Furthermore, the OLED device 130 is manufactured on one side of the flexible substrate 110, and the adhesive-filling layer 140 and the border adhesive 150 (a dam adhesive material) are applied on another side, and then the adhesive-filling layer 140 and the border adhesive 150 are attached to the OLED device 130 by bending the first substrate part 210 or the second substrate part 220, thereby completing the encapsulation of the OLED substrate 100. The OLED substrate 100 is provided with the adhesive-filling layer 140 and the border adhesive 150 at edges, which both have water-resistant properties, and the inorganic barrier layer 120 of the flexible substrate 110 is also water-resistant. As a result, the present application can achieve a multi-layer and effective encapsulation, thus avoiding the OLED device 130 from an influence of moisture and oxygen and enhancing the encapsulation effect and improving the service life of the OLED substrate 100.

In summary, although the present invention is described in connection with its specific embodiments, it should be understood that many alternatives, modifications and variations will be apparent to those skilled in the art. Accordingly, the present invention comprises all substitutions, modifications and variations that fall within the scope of the appended claims.

What is claimed is:

1. An encapsulation method for a flexible organic light-emitting diode (OLED) substrate, comprising following steps:

providing a glass substrate, wherein the glass substrate comprises a first substrate portion and a second substrate portion connected to each other;

providing a flexible substrate on the first substrate portion and the second substrate portion, and producing an inorganic barrier layer on a surface of the flexible substrate away from the glass substrate;

producing an OLED device on the inorganic barrier layer corresponding to the first substrate portion, and producing an adhesive-filling layer on the flexible substrate corresponding to the second substrate portion; and bending the first substrate portion to press against the second substrate portion or bending the second substrate portion to press against the first substrate portion, so that the flexible substrate is spaced apart from the OLED device by the adhesive-filling layer and covers the OLED device.

2. The encapsulation method for the flexible OLED substrate according to claim 1, wherein the step of providing the glass substrate further comprises forming a gap between the first substrate portion and the second substrate portion.

3. The encapsulation method for the flexible OLED substrate according to claim 2, wherein in the step of producing the flexible substrate, the flexible substrate forms a base substrate, a bending portion, and an covering portion, wherein a thin film transistor (TFT) layer is formed on the base substrate and drives the OLED device to emit light, the bending portion is connected to the base substrate and the covering portion, the covering portion covers the adhesive-filling layer and is stacked above the base substrate, and the gap is formed by cutting and allows formation of the bending portion.

4. The encapsulation method for the flexible OLED substrate according to claim 1, wherein the step of producing the adhesive-filling layer further comprises coating a border adhesive on an edge of the second substrate portion, wherein the border adhesive is connected to the adhesive-filling layer, wherein when the flexible substrate is bent and covers the OLED device, the inorganic barrier layer, the adhesive-filling layer, and the border adhesive together enclose the OLED device, and wherein the adhesive-filling layer and the border adhesive are formed on two edges of the OLED device.

5. The encapsulation method for the flexible OLED substrate according to claim 4, wherein after the step of bending the first substrate portion to press against the second substrate portion or bending the second substrate portion to press against the first substrate portion, the encapsulation method further comprises peeling the glass substrate and curing the border adhesive; after the glass substrate is peeled, detaching the glass substrate from the flexible substrate to expose the flexible substrate; curing the border adhesive by ultraviolet light to form a sealant frame to complete encapsulation of the OLED substrate.

6. The encapsulation method for the flexible OLED substrate according to claim 1, wherein a thickness of the inorganic barrier layer ranges from 100 nm and 5000 nm, and a material of the inorganic barrier layer comprises one or more of aluminum oxide, titanium oxide, chromium oxide, silicon nitride, silicon oxynitride, or silicon oxide.

7. An encapsulation method for a flexible organic light-emitting diode (OLED) substrate, comprising following steps:
providing a glass substrate, wherein the glass substrate forms a first substrate portion and a second substrate portion connected to each other;
providing a flexible substrate on the first substrate portion and the second substrate portion, and producing an inorganic barrier layer on a surface of the flexible substrate away from the glass substrate;
producing an OLED device on the inorganic barrier layer corresponding to the first substrate portion, and producing an adhesive-filling layer on the flexible substrate corresponding to the second substrate portion; and
bending the first substrate portion to press against the second substrate portion or bending the second substrate portion to press against the first substrate portion.

8. The encapsulation method for the flexible OLED substrate according to claim 7, wherein the step of providing the glass substrate further comprises forming a gap between the first substrate portion and the second substrate portion.

9. The encapsulation method for the flexible OLED substrate according to claim 8, wherein in the step of producing the flexible substrate, the flexible substrate forms a base substrate, a bending portion, and an covering portion, wherein a thin film transistor (TFT) layer is formed on the base substrate and drives the OLED device to emit light, the bending portion is connected to the base substrate and the covering portion, and the covering portion covers the adhesive-filling layer and is stacked above the base substrate, wherein the gap is formed by cutting and allows formation of the bending portion.

10. The encapsulation method for the flexible OLED substrate according to claim 7, wherein the step of producing the adhesive-filling layer further comprises coating a border adhesive on an edge of the second substrate portion, wherein the border adhesive is connected to the adhesive-filling layer; when the flexible substrate is bent and covers the OLED device, the flexible substrate is spaced apart from the OLED device by the adhesive-filling layer; the inorganic barrier layer, the adhesive-filling layer, and the border adhesive together enclose the OLED device; the adhesive-filling layer and the border adhesive are formed on two edges of the OLED device.

11. The encapsulation method for the flexible OLED substrate according to claim 10, wherein after the step of bending the first substrate portion to be pressed against the second substrate portion or bending the second substrate portion to be pressed against the first substrate portion, the encapsulation method further comprises peeling the glass substrate and curing the border adhesive; after the glass substrate is peeled, detaching the glass substrate from the flexible substrate to expose the flexible substrate; and curing the border adhesive by ultraviolet light to form a sealant frame to complete an encapsulation of the OLED substrate.

12. The encapsulation method for the flexible OLED substrate according to claim 7, wherein a thickness of the inorganic barrier layer ranges from 100 nm and 5000 nm, and a material of the inorganic barrier layer comprises one or more of aluminum oxide, titanium oxide, chromium oxide, silicon nitride, silicon oxynitride, or silicon oxide.

\* \* \* \* \*